United States Patent [19]
Ma

[11] Patent Number: 5,548,622
[45] Date of Patent: Aug. 20, 1996

[54] METHOD AND STRUCTURE FOR SYNCHRONIZATION OF ASYNCHRONOUS SIGNALS

[75] Inventor: Herman H. Ma, Dallas, Tex.

[73] Assignee: SGS-Thomson Microelectronics, Inc., Carrollton, Tex.

[21] Appl. No.: 409,744

[22] Filed: Mar. 24, 1995

[51] Int. Cl.[6] ................... H04L 7/00; H04L 7/02
[52] U.S. Cl. ........................... 375/354; 375/360
[58] Field of Search .................... 375/354, 359, 375/360, 364, 259, 295, 316; 370/108; 326/93; 327/185, 197, 198, 199, 206, 201, 225, 141, 161

[56] References Cited

U.S. PATENT DOCUMENTS

| | | | |
|---|---|---|---|
| 4,800,296 | 1/1989 | Ovens et al. | 327/215 |
| 4,929,850 | 5/1990 | Breuninger | 327/185 |
| 4,979,190 | 12/1990 | Sager et al. | 375/354 |
| 5,303,350 | 4/1994 | Yu et al. | 327/215 |
| 5,387,825 | 2/1995 | Cantrell et al. | 326/26 |

*Primary Examiner*—Stephen Chin
*Assistant Examiner*—Huong Luu
*Attorney, Agent, or Firm*—Renee M. Larson; Lisa K. Jorgenson

[57] ABSTRACT

According to the present invention, synchronization between two or more asynchronous devices or systems is accomplished according to the clock edges of the asynchronous devices or systems rather synchronization through sampling of the clock frequencies of the asynchronous devices or systems. Because synchronization is dependent on the clock edges rather than frequencies, there are two readily apparent advantages. First, it is no longer necessary to sample data in order to determine frequencies of the asynchronous devices or systems. Second, the data transmitted from a transmitter device, such as a microprocessor, to a receiver device, such as a printer, can be assured of being stable data before being received by the receiver device. Because the data received by the receiver device is not in transition or otherwise meta-stable, it is valid, uncorrupted data.

19 Claims, 1 Drawing Sheet

METHOD AND STRUCTURE FOR SYNCHRONIZATION OF ASYNCHRONOUS SIGNALS

BACKGROUND OF THE INVENTION

1. Field of the Invention

The present invention relates generally to. synchronization of two or more asynchronous devices or systems, and more specifically to synchronization of such asynchronous devices or systems such that only stable data is exchanged when the frequencies of the devices or systems to be synchronized may or may not be unknown.

2. Description of the Prior Art

There are many times when it is necessary to exchange data between two or more asynchronous devices or systems, i.e. devices or systems having different operating frequencies as defined by their clock frequencies. Such is the case in many "handshaking" applications where data is transmitted at one frequency, but received at another frequency. A common example is the print interface between a computer and a printer where the computer typically provides data to the printer at a much faster rate than the printer is capable of handling. Thus, the printer has a printer buffer which may make use of FIFO (First In First Out) technology or other interface technology to manage the asynchronous exchange of data from the computer to the printer.

Of primary concern in asynchronous transfer of data is that the data be in a stable condition when transferred from a transmitter device to a receiver device. If the data is in transition or otherwise in a meta-stable state, the data received by the receiver device may be faulty. Thus, in an asynchronous handshake situation, it is a concern that data will be not valid when read asynchronously. When data is sent from a transmitter device to a receiver device where the transmitter and receiver devices operate at different frequencies and do not share a common clock, usually the receiver device will send an active signal, such as a chip select signal, to the transmitter device requesting data. After a specific time, the chip select signal will become inactive and then the receiver will use this state change from an active to an inactive state to latch in data from the transmitter to the receiver. The difficulty with this approach arises when the transmitted data is still in transition as it is being latched into the receiver device. Thus, there exists an unmet need in the art to be able to ensure that only stable data, not data in transition, will be latched into the receiver device.

In order to exchange data between two different frequency entities, frequency sampling is commonly utilized to synchronize the frequencies. A sampling circuit usually requires a sampling clock frequency at least two times faster than the frequency of the sampled data. Synchronization is then accomplished with respect to the faster clock. However, the frequencies of devices being synchronized may not always be known. This is especially true when the frequencies are not static and change over time. Additionally, the difficulty of ascertaining relative frequencies has become more of a concern as applications require faster and faster frequencies. Thus, there is an unmet need in the art to be able to synchronize two signals even when it is unclear which is the faster of the two signals.

SUMMARY OF THE INVENTION

It would be advantageous in the art to be able to ensure that only stable data of a transmitter device, not data in transition, will be latched into a receiver device where the transmitter device and the receiver device are characterized as being asynchronous devices.

It would further be advantageous in the art to be able to synchronize two asynchronous devices or systems even when the frequencies of the asynchronous devices or systems is not known.

Therefore, according to the present invention, synchronization between two or more asynchronous devices or systems is accomplished according to the clock edges of the asynchronous devices or systems rather than synchronization through sampling of the clock frequencies of the asynchronous devices or systems. Because synchronization is dependent on the clock edges rather than frequencies, there are two readily apparent advantages. First, it is no longer necessary to sample data in order to determine frequencies of the asynchronous devices or systems. Second, the data transmitted from a transmitter device, such as a microprocessor, to a receiver device, such as a printer, can be assured of being stable data before being received by the receiver device. Because the data received by the receiver device is not in transition or otherwise meta-stable, it is valid, uncorrupted data.

A pulse signal with pulse time duration relative to validity time of the data signal of the transmitting device is created by latching and synchronization circuitry. This pulse signal is used to force a first condition whereby no latching of the data signal into receiver device is allowed when the validity of the data signal is uncertain and a second condition whereby latching of the data signal into the receiver device is allowed when the validity of the data signal is assured. The duration of the pulse signal is determined from the rising (or falling) edge of the clock signal of the transmitting device and is at least long enough to ensure that the data signal of the transmitting device is not in transition and is thus stable.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The present invention provides for synchronization between two or more asynchronous devices when it is unknown what are the frequencies of the devices. Additionally, the present invention ensures that only stable, and not transitional or meta-stable, data are received by a receiver device. Thus, the present invention addresses prior art concerns discussed in the Background of the Invention discussed above.

In a "handshake" situation between two or more asynchronous devices, it is a concern that data not become invalid when it is read asynchronously into a receiving device from a transmitting device. As noted in the Background of the Invention, when data is sent from a transmitter to a receiver where the transmitter and receiver operate at different frequencies, and are therefore asynchronous, and do not share a common clock, usually the receiver will send an active request signal, such as a chip select signal, to the transmitter requesting data, and after a specific time, the chip select signal will become inactive and then the receiver will use the state change from active to inactive to latch in data from the transmitter to the receiver. The difficulty with this approach to latching in data from the transmitter to the receiver arises when the transmitted data is still in transition as its being latched into the receiver.

Since data validity is relative to clock changes in a synchronous design, one can create a signal (dead time) with time pulse duration relative to data validity time duration, all relative to the same clock changes This signal (dead time) will be used to force no latching when data validity is uncertain and allow latching when data are valid as indicated by the inactive signal (dead time).

Figure 1:
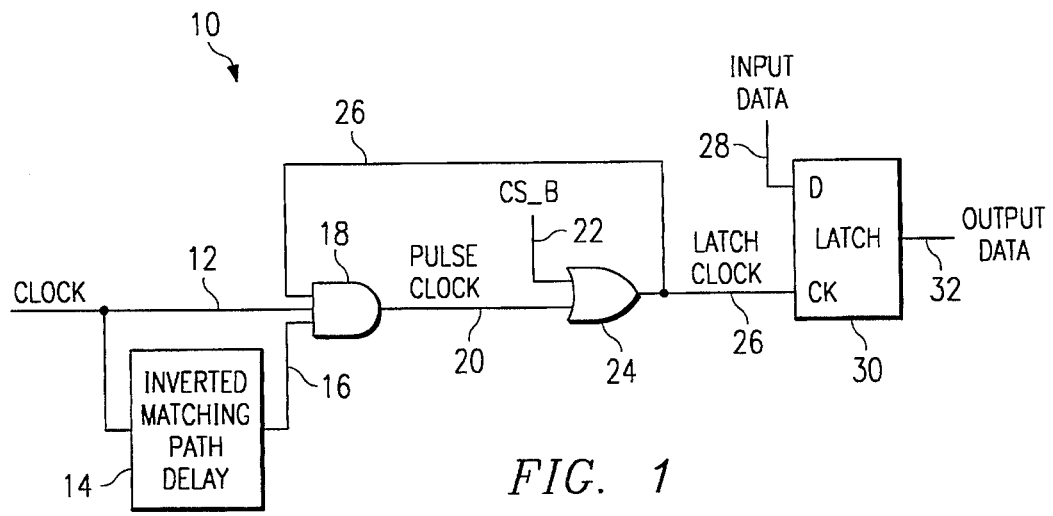
FIG. 1 is a schematic diagram of latching and synchronization circuitry, according to a first embodiment of the present invention.

To ensure the transmitted data is not in transition when the receiver is actually latching in data, a first preferred embodiment of the present invention utilizes the latching and synchronization circuitry 10 of FIG. 1. Latching circuitry 10 contains the following elements: an Inverter Matching Path Delay block 14, an AND logic gate 18, OR logic gate 24, and latch 30. One of ordinary skill in the art will appreciate that there are a variety of logic gates which may be substituted for AND logic gate 18 and OR logic gate 24 which, along with corresponding minor changes to latching and synchronization circuitry 10 of FIG. 1, do not depart from the spirit and scope of the invention.

Clock signal 12 is the clock signal of the transmitted data Input Data signal 28 and is passed through Inverter Matching Path Delay block 14 which inverts and delays Clock signal 12 to produce derivative clock signal 16. Input Data signal 28 is synchronous to Clock signal 12. The desired delay introduced by Inverter Matching Path Delay block 14 is at least the amount of time required for Input Data signal 28 to become stable so as not to be in transition; thus, the delay time of Inverter Matching Path Delay block 14 may be determined by the RC constant of Input Data signal 28.

Clock signal 12, signal 16, and Latch Clock signal 26 are input signals to AND gate 18 which produces Pulse Clock signal 20 as an output signal. Pulse Clock signal 20 is determined by the rising edge of Clock signal 12 and thus has a high duration time equal to the delay time which is required for Input Data signal 28 to become stable from the rising edge of Clock signal 12, as defined by Inverted Matching Path Delay block 14; the delay time could also be determined from the falling edge of Clock signal 12 and whether the delay time is recognized from the rising or falling edge of Clock signal 12 is a function of whether Input Data signal 28 is recognized from the rising or falling edge of Clock signal 12. Pulse Clock signal 20 and Chip Select bar CS_bar signal 22, the active low request signal sent from the receiving device to the transmitting device requesting Input Data signal 28, together produce Latch Clock signal 26 which feeds the internal clock input of latch 30 as shown. When it is desired that Data In 28 be latched into Latch 30, Chip Select bar CS_bar signal 22 will be returned to a high logic level. Since Latch Clock signal 26 is determined in part by Pulse Clock signal 20 which has a high duration time equal to the delay time for Input Data 28 to become stable from the rising edge of Clock signal 12, Latch Clock signal 26 is forced to remain at a high logic level when Input Data 28 is unstable and in transition. When Latch Clock 26 is a low logic level, Input Data signal 28 is stable data and thus latch 30 latches in Input Data signal 28; however, when Latch Clock 26 is a high logic level, Input Data signal 28 is in transition and thus latch 30 only samples Input Data 28. Chip Select bar CS_B signal 22 is an asynchronous input signal to OR gate 24 which latches data into latch 30.

According to the above description of FIG. 1, latch 30 will only latch in stable data because latch 30 will be forced to continue to sample Input Data signal 28, even if Chip Select bar CS_B signal 22 is a low logic level, if Chip Select bar CS_B signal 22 became a low logic level at a time Input Data signal 28 is still in transition. Inverter Matching Path Delay Block 14 together with AND gate 18 force Pulse Check 20 to remain a high logic level from the rising edge of Clock signal 12 until Input Data signal 28 is stable data. Because Data Input signal 28 is not latched into latch 30 until it is stable, Output Data signal 32 of latch 30 is representative of stable data.

The latching and synchronization circuitry 10 of FIG. 1 can be used in a wide variety of asynchronous "handshake" applications to ensure that only stable data is received by the receiver device. Examples of such applications include, but are not limited to, microprocessor handshake with outside world components and data communications where it is necessary to accurately keep track of overhead information of incoming data, such as a data header which conveys the type of data being received.

Also, as described in the Background of the Invention, in order to exchange data between two or more systems or devices operating asynchronously, frequency sampling has typically been utilized to synchronize the disparate frequencies of the asynchronous systems or devices. Typically, a sampling circuit usually requires a sampling clock frequency at least two times faster than the frequency of the sampled data. Synchronization is then accomplished with respect to the faster clock. Often it is difficult or impossible to determine which one of the frequencies of two or more asynchronous signals is faster. This is especially true when the frequencies are not static in frequency and change over time. The present invention provides for the synchronization of two signals even when it is unclear which is the faster of the two signals.

Figure 2:
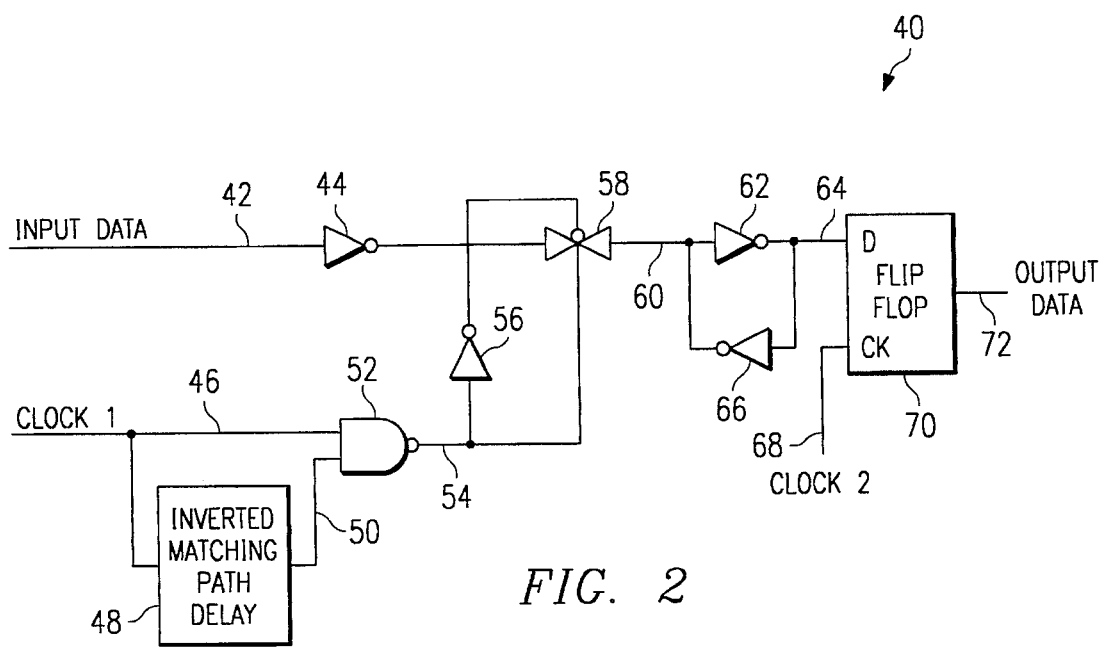
FIG. 2 is a schematic diagram of latching and synchronization circuitry, according to a second embodiment of the present invention.

Referring to FIG. 2, latching and synchronization circuitry 40, according to a second preferred embodiment-of the present invention, has the following components: inverters 44, 56, a latch comprised of inverters 62, 66, inverter Matching Path Delay Block 48, NAND logic gate 52, transfer gate 58; and clocked Flip Flop 70. Clock1 is the clock signal of Input Data signal 42 while Clock 2 is the clock signal of Output Data signal 72. Clock1 signal 46 is inverted and delayed by passing through Inverter Matching Path Delay Block 48 to produce derivative clock signal 50. Signal 50 and Clock1 signal 46 are input signals to NAND logic gate 52 which produces signal 54. Signal 54 and signal 57, the inverse of signal 54 produced by inverter 56, control transfer gate 58 and determine when signal 45, the inverse signal of Input Data signal 42 produced by inverter 44, will be passed through transfer gate 58 as Latch Clock signal 60. Latch Clock signal 60 is supplied to the latch comprised of inverters 62 and 66 which provides signal 64 to the internal data input of clocked Flip Flop 70. Clocked Flip Flop 70 is clocked by Clock2 signal 68, the clock signal of the receiving device. Output Data signal 72 is the output signal of clocked Flip Flop 70.

The Latch Clock signal 60 is a pulse signal created as a function of Clock1 signal 46 and Inverter Matching Path Delay Block 48 where the duration of the pulse of Latch Clock signal 60 is equal to the delay time required for Input Data signal 42 to become stable from the rising edge of Clock1 signal 46. The delay time is defined as the matching path delay time which Input Data signal 42 had to traverse before arriving at the input of latching and synchronization circuit 40 from the rising edge of Clock1 signal 46. One of ordinary skill in the art will recognize that, with only minor modifications to latching and synchronization circuit 40, the duration of the pulse of Latch Clock signal 60 may be equal to the delay time for Input Data signal 42 to become stable from the falling edge, rather than the rising edge, of Clock1 signal 46.

Latch Clock signal 60 is generated as a function of Inverter Matching Path Delay Block 48 and NAND logic gate 52. Latch Clock signal 60 is a function of Clock1 signal 46; thus, any changes in the state of Clock1 signal 46 causes Input Data signal 42 to be only sampled and not latched into Flip Flop 70. This ensures that only stable data will be latched into Flip Flop 70. The latch comprised of inverters 62 and 66 holds old data when Input Data signal 42 is in transition and lets new data pass through the latch when Input Data signal 42 is no longer in transition and is stable. Thus, when incoming Clock1 signal 52 is active, the latch holds stable data and when Clock1 signal 52 is not active, the latch is turned on and samples incoming Input Data 42. In this way, Clock2 signal 68 is always assured of being able to synchronize to a stable Input Data signal 42 and Output Data signal 72 will always be synchronized to Clock2 signal 68. The synchronization circuit 40 of FIG. 2 ensures that meta-stable data states of Input Data signal 42 are not latched into Flip Flop 70 and passed out as Output Data signal 72. These advantages are accomplished without the need for knowledge of the frequencies of Clock1 signal 42 and Clock2 signal 68 and thus the present invention provides an important advantage over the prior art where it was necessary to ascertain the relative frequencies of the two signals to be synchronized.

The latching and synchronization circuitry 40 of FIG. 2 is especially suited for the difficult situation where Input Data signal 42 is constantly changing, because synchronization between the two signals is a function of the rising edge of Clock1 signal 46 rather than the frequencies of Clock1 signal 42 and Clock2 signal 68. Thus, the present invention is especially well suited for use in a wide variety of handshake applications, such as FIFO technology and ATM (Asynchronous Transfer Mode) data communications technology such as the new Utopia interface standard for communications.

According to the present invention, the actual frequencies of the clock signals of two or more asynchronous systems need not be known in order to effectuate synchronization between the asynchronous systems. Actual frequencies of the clocks are immaterial and do not need to be determined since synchronization done according to clock edges rather than frequencies, unlike the prior art where must determine the frequency of the fastest signal in order to synchronize. This synchronization which is accomplished according to clock edges rather than frequencies ensures that synchronization occurs with respect to the faster clock frequency. Additionally, effective synchronization is not hampered by frequency changes of either signal; any time clock rate changes, the pulse width tracks this change and automatically get fastest clock frequency. This is different from the prior art where frequency sampling was necessary to determine the faster of two signals and synchronization was performed with respect to the faster signal.

The present invention may be utilized as a means to synchronize asynchronous signals in virtually any environment where handshaking capabilities are required. Thus, the invention may be used in a broad spectrum of applications where a variety of technologies, such as FIFOs, data communication devices, and microprocessors, are used.

While the invention has been particularly shown and described with reference to a preferred embodiment, it will be understood by those skilled in the art that various changes in form and detail may be made therein without departing from the spirit and scope of the invention.

What is claimed is:

1. A method for ensuring that data of a transmitting device which is received by a receiving device is stable and not in transition, comprising the steps of:

transmitting a data and a clock signal corresponding to the data from a transmitting device;

determining a minimum delay time required for the data to become stable as defined by the clock signal corresponding to the data;

creating a pulse signal having a pulse time duration at least as long as the minimum delay time required for the data to become stable; and selectively allowing the data to be received by a receiving device, wherein when the pulse signal is equal to a first logic state the data is stable and may be received by the receiving device and when the pulse signal is equal to a second logic state the data is in transition and may not be received by the receiving device.

2. The method of claim 1, wherein when the pulse signal is equal to the first logic state, the data is stable and is latched into the receiving device.

3. The method of claim 1, wherein when the pulse signal is equal to the second logic state, the data is in transition and is sampled by the receiving device.

4. The method of claim 1, wherein the pulse time duration of the pulse signal is determined from the falling edge of the clock signal.

5. The method of claim 1, wherein the pulse time duration of the pulse signal is determined from the rising edge of the clock signal.

6. The method of claim 1, wherein the transmitting device is asynchronous with respect to the receiving device.

7. The method of claim 1, wherein the step of creating the pulse signal is accomplished by performing a logic operation on the clock signal and a derivative clock signal, which is produced by introducing the pulse time duration to the clock signal through an inverted matching path delay block.

8. The method of claim 7, wherein the step of creating the pulse signal is further accomplished by performing a logic operation on the clock signal, the derivative clock signal, and a request signal sent from the receiving device to the transmitting device requesting the data.

9. The method of claim 1, wherein the transmitting device is a computer and the receiving device is a printer.

10. A structure for ensuring that data of a transmitting device which is received by a receiving device is stable and not in transition, comprising:

a data of a transmitting device;

a clock signal corresponding to the data which is representative of an operating frequency of the transmitting device;

an inverted matching path delay block which has the clock signal as an input signal and which produces a derivative clock signal having a minimum delay time required for the data to become stable as defined by the clock signal;

a first logic element which performs a logic operation on the clock signal, the derivative clock signal, and a latch signal to produce a pulse signal having a pulse time duration at least as long as the minimum delay time required for the data to become stable;

a second logic element which performs a logic operation on the pulse signal and a request signal from the receiving device requesting the data from the transmitting device and produces said latch signal which is an input signal to the first logic element; and a latch element which has the data of the transmitting device as a data input signal, the latch signal produced by the second logic element as a clock input signal and which produces a data output signal, wherein when the data is stable as determined by the pulse signal the latch signal latches the data into the latch element and when the data is in transition as determined by the pulse signal the latch element samples the data and the data is not latched into the latch element.

11. The structure of claim 10, wherein the pulse time duration of the pulse signal is determined from the falling edge of the clock signal.

12. The structure of claim 10, wherein the pulse time duration of the pulse signal is determined from the rising edge of the clock signal.

13. The structure of claim 10, wherein the transmitting device is asynchronous with respect to the receiving device.

14. The structure of claim 10, wherein the transmitting device is a computer and the receiving device is a printer.

15. A structure for ensuring that data of a transmitting device which is received by a receiving device is stable and not in transition, comprising:

a data of a transmitting device;

a first clock signal corresponding to the data which is representative of an operating frequency of the transmitting device;

an inverted matching path delay block which has the first clock signal as an input signal and which produces a derivative clock signal having a minimum delay time required for the data to become stable as defined by the first clock signal;

a first logic element which performs a logic operation on the first clock signal and the derivative clock signal to produce a first control signal;

a transfer element having the data of the transmitting device as an input signal, wherein the transfer element is controlled by the first control signal and a second control signal, defined as the inverse of the first control signal, which determine when the data is passed through the transfer element as a pulse signal, wherein the pulse signal has a pulse time duration at least as long as the minimum delay time required for the data to become stable; and a latch element having the pulse signal as a data input signal and a second clock signal, representative of an operating frequency of the receiving device, as a clock input signal, wherein when the data is stable as determined by the pulse signal the second clock signal latches the data into the latch element and when the data is in transition as determined by the pulse signal the latch element samples the data and the data is not latched into the latch element.

16. The structure of claim 15, wherein the pulse time duration of the pulse signal is determined from the falling edge of the clock signal.

17. The structure of claim 15, wherein the pulse time duration of the pulse signal is determined from the rising edge of the clock signal.

18. The structure of claim 15, wherein the transmitting device is asynchronous with respect to the receiving device.

19. The structure of claim 15, wherein the transmitting device is a computer and the receiving device is a printer.

* * * * *